(12) United States Patent
Ozaki et al.

(10) Patent No.: US 8,378,489 B2
(45) Date of Patent: Feb. 19, 2013

(54) SEMICONDUCTOR DEVICE AND MANUFACTURING METHOD THEREFOR

(75) Inventors: Shiro Ozaki, Kawasaki (JP); Yoshihiro Nakata, Kawasaki (JP); Yasushi Kobayashi, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 12/544,371

(22) Filed: Aug. 20, 2009

(65) Prior Publication Data

US 2009/0309221 A1 Dec. 17, 2009

Related U.S. Application Data

(63) Continuation of application No. PCT/JP2007/000212, filed on Mar. 13, 2007.

(51) Int. Cl.
*H01L 29/40* (2006.01)

(52) U.S. Cl. ........ 257/751; 257/758; 257/759; 257/760; 257/774; 524/588; 528/30; 528/31; 528/35; 438/781; 438/970

(58) Field of Classification Search .......... 257/751, 257/759, 774, 758, 760; 524/588; 528/30, 528/31, 35; 438/781, 970
See application file for complete search history.

(56) References Cited

U.S. PATENT DOCUMENTS

| | | | | |
|---|---|---|---|---|
| 5,304,623 A * | 4/1994 | Ito et al. | ........................... | 528/28 |
| 5,750,643 A * | 5/1998 | Blum et al. | .................... | 528/481 |
| 5,976,703 A * | 11/1999 | Nakata et al. | .................. | 428/447 |
| 5,990,024 A * | 11/1999 | Blum et al. | ..................... | 501/88 |
| 6,524,376 B2 | 2/2003 | Aoki et al. | | |
| 6,566,261 B2 | 5/2003 | Ikegami et al. | | |
| 6,613,834 B2 * | 9/2003 | Nakata et al. | ................. | 524/588 |
| 6,727,515 B2 * | 4/2004 | Nakata et al. | ................... | 257/40 |
| 6,764,950 B2 | 7/2004 | Noguchi et al. | | |
| 6,821,882 B2 | 11/2004 | Okada | | |
| 6,828,684 B2 | 12/2004 | Ikegami et al. | | |
| 6,958,525 B2 * | 10/2005 | Nakata et al. | ................. | 257/642 |
| 7,081,673 B2 * | 7/2006 | Hedrick et al. | ............... | 257/751 |
| 7,186,354 B2 | 3/2007 | Aoki et al. | | |
| 7,187,081 B2 * | 3/2007 | Huang et al. | .................. | 257/759 |
| 7,232,757 B2 | 6/2007 | Noguchi et al. | | |
| 7,262,142 B2 * | 8/2007 | Nakata et al. | ................. | 438/795 |
| 7,307,344 B2 | 12/2007 | Minamihaba et al. | | |
| 7,358,299 B2 * | 4/2008 | Nakata et al. | ................. | 524/588 |

(Continued)

FOREIGN PATENT DOCUMENTS

| | | |
|---|---|---|
| JP | 2001-207170 A | 7/2001 |
| JP | 2001-319913 A | 11/2001 |

(Continued)

OTHER PUBLICATIONS

International Search Report of PCT/JP2007/000212, Mailing Date of Jun. 19, 2007.

(Continued)

*Primary Examiner* — Cathy Lam
(74) *Attorney, Agent, or Firm* — Westerman, Hattori, Daniels & Adrian, LLP

(57) ABSTRACT

A semiconductor device of this invention has a copper wiring layer, of which a layer, to which a composition including at least one substance selected from the group consisting of ammonia and organic bases is applied, and a silicon-containing insulating film are sequentially superimposed on the copper wiring layer. Accordingly, semiconductor devices having insulating layers which adheres well to the copper serving as the wiring material can be obtained.

19 Claims, 1 Drawing Sheet

U.S. PATENT DOCUMENTS

| | | | |
|---|---|---|---|
| 7,399,715 | B2 | 7/2008 | Tsuchiya et al. |
| 7,655,576 | B2 * | 2/2010 | Ozaki et al. ............... 438/781 |
| 2002/0081839 | A1 | 6/2002 | Shimooka et al. |
| 2003/0083214 | A1 | 5/2003 | Kakizawa et al. |
| 2004/0157443 | A1 | 8/2004 | Shimooka et al. |
| 2007/0262449 | A1 | 11/2007 | Bispo et al. |
| 2008/0124927 | A1 | 5/2008 | Minamihaba et al. |
| 2008/0132059 | A1 | 6/2008 | Noguchi et al. |

FOREIGN PATENT DOCUMENTS

| | | |
|---|---|---|
| JP | 2002-203857 A | 7/2002 |
| JP | 2004-146600 A | 5/2004 |
| JP | 2004-235415 A | 8/2004 |
| JP | 2006-179599 A | 7/2006 |
| JP | 2006-261268 A | 9/2006 |
| JP | 2006-303179 A | 11/2006 |
| JP | 2006-351877 A | 12/2006 |
| JP | 2009-529229 A | 8/2009 |
| KR | 10-0511039 B1 | 8/2005 |
| KR | 10-0698987 B1 | 3/2007 |
| KR | 10-0710097 B1 | 4/2007 |
| WO | 01/71789 A1 | 9/2001 |

OTHER PUBLICATIONS

Chinese Office Action dated Aug. 5, 2010, issued in corresponding Chinese Patent Application No. 200780052132.7.

Korean Office Action dated Mar. 7, 2011, issued in corresponding Korean Patent Application No. 10-2009-7019958.

Taiwanese Office Action dated Jul. 21, 2011, issued in corresponding Taiwanese Patent Application No. 096108523.

Japanese Office Action dated May 8, 2012, issued in corresponding Japanese Patent Application No. 2009-503757, with Partial translation (7 pages).

Japanese Office Action dated Feb. 28, 2012, issued in corresponding Japanese Patent Application No. 2009-503757, with Partial English Translation, 4 pages.

* cited by examiner

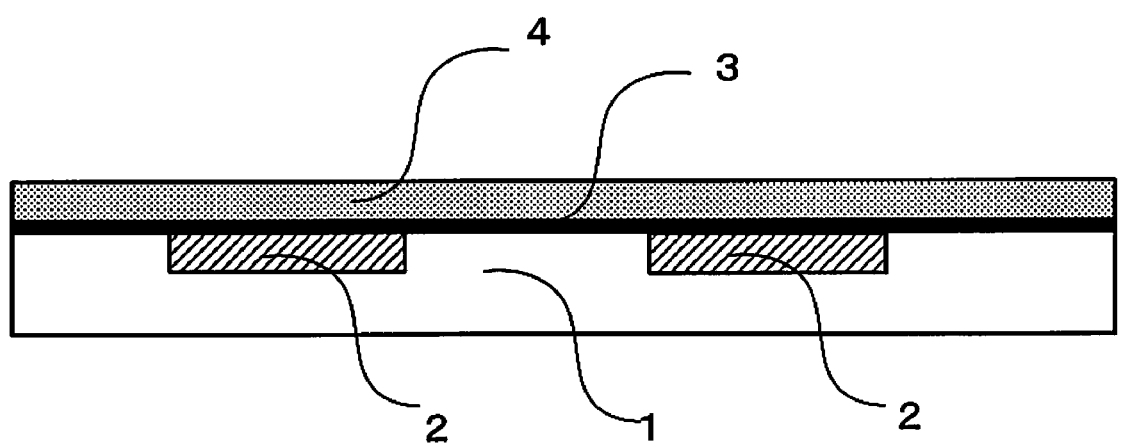

SEMICONDUCTOR DEVICE AND MANUFACTURING METHOD THEREFOR

CROSS-REFERENCE TO RELATED APPLICATIONS

This application is a continuation of international application PCT/JP2007/000212, filed on Mar. 13, 2007.

TECHNICAL FIELD

The present invention relates to semiconductor devices such as semiconductor integrated circuits and multilayer wiring devices, and a method of manufacturing such devices.

BACKGROUND ART

With the rising level of integration in semiconductor devices such as semiconductor integrated circuits and multilayer wiring devices and with higher device densities, line spacings have become narrower, leading to the problem of wire delay due to increased capacitance between lines.

Although increases in power consumption due to leakage currents in wiring layer insulating films have hitherto been known, in generations of semiconductor devices having line spacings greater than 1 µm, the influence of such leakage currents on the overall device has been small. However, at line spacings not greater than 1 µm, owing to the tight dimensions of the spacing and the increase in the scale of the wiring, such leakage currents have a greater influence on power consumption. In particular, as circuits come to be formed at line spacings not greater than 0.1 µm, the leakage current between lines will exert a large influence on the characteristics and life of the device.

The wire delay T is affected both by the line resistance and the capacitance between lines. Letting the line resistance be R and the capacitance between lines be C, the wire delay is the quality expressed as $$T \propto CR.$$

In this formula, letting the line spacing be D, the electrode surface area (surface area of opposed wiring faces) be S, the dielectric constant of a vacuum be $\epsilon 0$ and the specific dielectric constant of the insulating material provided between the lines be $\epsilon r$, the capacitance C between the lines is expressed as $$C = \epsilon 0 \epsilon S/D.$$

Hence, lowering the dielectric constant of the insulating film is an effective way to make the wire delay smaller.

Currently, to lower the dielectric constant of an insulating film, the multilayer wiring structure of a semiconductor device is often formed of copper lines obtained by electroplating and low-k insulating films (or insulating layers)—also called, depending on the case, etch stoppers, diffusion preventing films or diffusion preventing layers, interlayer insulating films or interlayer insulating layers, etc.—which are formed by spin-on glass (SOG) or plasma chemical vapor deposition (CVD).

However, these insulating films adhere poorly to the copper serving as the wiring material, resulting in film separation at the interface. This is thought to be due to the influence of copper oxide that forms at the surface of the copper with exposure to the atmosphere. Although techniques for removing copper oxide by $H_2$ annealing (heat treatment in a hydrogen-containing atmosphere) or $H_2$ plasma treatment prior to formation of the insulating film are currently in use, film separation continues to be observed. Hence, a satisfactory solution remains to be found (see Patent Document 1).

Patent Document 1: Japanese Patent Application Laid-open No. 2006-303179 (Claims)

DISCLOSURE OF THE INVENTION

Problems to be Solved

It is therefore an object of the present invention to solve the problems and to provide a semiconductor device having insulating films which adhere well to the copper serving as the wiring material, and a method of manufacture thereof.

Means to Solve the Problems

According to one aspect, the present invention provides a semiconductor device having a copper wiring layer, in which a layer, to which a composition including at least one substance selected from the group consisting of ammonia and organic bases is applied, and a silicon-containing insulating film are sequentially superimposed on the copper wiring layer.

According to this aspect of the invention, semiconductor devices having insulating layers which adhere well to the copper serving as the wiring material can be obtained. This enables semiconductor devices having low-k insulating films with a high reliability to be achieved, which can help in particular to increase the response speed in semiconductor devices. Moreover, the improved adhesion is able to contribute also to improved mechanical properties (strength, etc.) in the insulating film.

It is preferable in this mode that the at least one substance is an amino group-containing substance, that the specific dielectric constant of the insulating film of the invention is 4.5 or below, that the insulating film has a density of from 1.0 to 3.0, that the insulating film contains Si—OH groups, that Cu—O—Si bonds are formed at a copper surface of the copper wiring layer, that the insulating film has: a composition which includes silicon and oxygen as primary ingredients, a composition which includes silicon, oxygen and carbon as primary ingredients, or a composition which includes silicon, oxygen and nitrogen as primary ingredients, that the insulating film is made of a compound which includes on a main chain silicon, and at least one of carbon and nitrogen, and optionally includes oxygen, and wherein groups bonded to the main chain are hydrocarbon groups which may be substituted with hydroxyl groups, and that the compound is selected from the group consisting of polycarbosilanes of Formula 1 below, polysilazanes of Formula 2 below, and these silicon compounds in which some or all of the moieties $R^1$ to $R^3$ are substituted with OH groups:

[Formula 1]

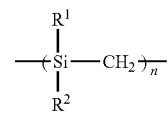

(1)

[Formula 2]

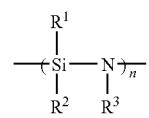

(2)

(wherein $R^1$, $R^2$ and $R^3$ are each independently, and independently for Formulas 1 and 2, a hydrogen atom, a substituted or unsubstituted alkyl group, a substituted or unsubstituted alkenyl group, a substituted or unsubstituted cycloalkyl group, or a substituted or unsubstituted aryl group; and n is an integer from 10 to 1,000).

According to another mode, the present invention provides a method of manufacturing a semiconductor device having a copper wiring layer, the method including: forming a copper wiring layer; applying to the copper wiring layer a composition which includes at least one substance selected from the group consisting of ammonia and organic bases; and then forming a silicon-containing insulating film.

In this mode, the same preferred form embodiment exists as the above described mode. Additionally, it is further preferable that a copper surface of the copper wiring layer is oxidized before applying the composition; that Cu—O—Si bonds are formed at the copper surface of the copper wiring layer; that energy imparting treatment is carried out after applying the composition; that the energy imparting treatment is a treatment selected from the group consisting of heat treatment, electron beam irradiation treatment, ultraviolet light irradiation treatment, x-ray irradiation treatment, and any combination thereof, and that a silane coupling agent is applied onto the copper wiring layer before or after applying the inventive composition.

The semiconductor device produced according to this aspect of the invention is a semiconductor device which has low-k insulating films with a high reliability, and is conducive in particular to higher response speeds. Such semiconductor devices may be advantageously employed in multilayer wiring devices.

According to the present invention, semiconductor devices having insulating layers which adhere well to the copper serving as the wiring material can be obtained. This enables semiconductor devices having low-k insulating films with a high reliability to be achieved, which can help in particular to increase the response speed in semiconductor devices. Moreover, the improved adhesion is able to contribute also to improved mechanical properties (strength, etc.) in the insulating film.

BRIEF DESCRIPTION OF DRAWINGS

FIG. 1 shows a cross-section of a structure composed by depositing a copper film, and spin-coating an inventive composition and an insulating film on a silicon wafer by sputtering.

EXPLANATION OF MARKS

1 Copper wiring layer
2 Copper wiring
3 Composition according to the present invention
4 Insulating film

BEST MODE FOR CARRYING OUT THE INVENTION

Embodiments of the present invention will now be described with reference to the drawings. The embodiments are for assisting the understanding of the present invention, and not for limiting the application of the present invention to these embodiments. The scope of present invention covers the inventions defined by the claims and equivalents thereof.

It has been found that when the surface of copper used in wiring is treated with a specific composition, adhesion between the copper and a silicon-containing insulating film situated thereon can be enhanced.

That is, the semiconductor device according to the present invention has a copper wiring layer and, sequentially superimposed thereon, a layer obtained by applying to the copper wiring layer a composition which includes at least one substance selected from the group consisting of ammonia and organic bases, and a silicon-containing insulating film.

Adhesion between the copper of the copper wiring layer and the insulating film is thereby enhanced, reducing film separation at the interface. As a result, even with the use of low-k materials in which interfacial film separation has been a problem, semiconductor devices having insulating films of a high reliability can be achieved, which can help in particular to increase the response speed in semiconductor devices. Moreover, the improved adhesion is able to contribute also to improved mechanical properties (strength, etc.) in the insulating film.

Semiconductor devices in which the semiconductor device technology of the present invention can be applied may include any semiconductor device, such as semiconductor integrated circuits and multilayer wiring devices.

The copper wiring of the invention is not subject to any particular limitation, and may be copper wiring of any shape, thickness, width or length which has been produced by any method of manufacture. Electroplating is generally preferred. This copper wiring may be combined with another conductor, so long as it is possible to apply the aforementioned specific composition to the copper surface, such as in cases where copper is present on another metal and coating with the specific composition is carried out onto the copper.

The substance according to the invention is selected from the group consisting of ammonia and organic bases. That is, the inventive substance may be ammonia, a single organic base, a mixture of organic bases, or a mixture of ammonia with one or a plurality of organic bases. As used herein, "base" refers to a substance which is an electron pair donor.

The substance according to the invention has the role of improving adhesion between copper and an insulating film. The mechanism is thought to be as follows: Cu—OH bonds form through interactions between copper and the inventive substance. These Cu—OH bonds react with Si—OH groups in the insulating film, forming Cu—O—Si bonds. The presence of Cu—OH bonds can be confirmed by Fourier transform infrared spectroscopy (FT-IR).

The above organic base may be suitably selected from among known organic bases, preferred examples of which are amino group-containing substances such as primary amines, secondary amines and tertiary amines. These organic bases may include aliphatic (possibly including alicyclic) hydrocarbon groups, aromatic groups and heterocyclic groups. Illustrative examples include alkylamines such as ethylamine, phenylamine, benzylamine, ethylenediamine, pentane-1,2,5-triyltriamine, benzene-1,2,4,5-tetrayltetraamine, diethylamine, trimethylamine and butyl(ethyl)methylamine; 1-benzofuran-2-ylamine, 4-quinolylamine, bis(2-chloroethyl)amine, (2-chloroethyl)(propyl)amine, (1-chloroethyl)(2-chloroethyl)amine, methyl(methylsilyl)amine, O-methylhydroxylamine, O-acetylhydroxylamine, O-carboxyhydroxylamine, O-sulfohydroxylamine, N-phenylhydroxylamine and O-acetyl-N-methylhydroxylamine. These organic bases may be in the form of ions, such as ammonium ions or quaternary ammonium ions.

The composition of the invention may be made solely of the above substance. In such a case, the inventive composition will include a single compound.

Aside from the above substances, the inventive composition may include also other substances. Such substances may be of any type, provided the function of the above substance is not adversely affected, and may be selected from among, for example, water; organic substances which may include polar groups or polar bonds such as carboxyl groups, ester groups, carbonyl groups, hydroxyl groups and ether bonds; and silicon-containing compounds such as silane coupling agents. The water and organic substances may be substances which function as solvents or dispersants. Illustrative examples of solvents include water, ethanol/water, and xylene.

Including a silane coupling agent in the inventive composition sometimes further enhances adhesion to copper. Alternatively, or together with this, the silane coupling agent may be applied onto the copper wiring layer before or after applying the inventive composition. However, because interactions between the inventive composition and the copper may be disrupted if the silane coupling agent is applied prior to application of the inventive composition, it is generally preferable to apply the silane coupling agent following application of the inventive composition.

The inventive composition preferably does not include amounts of inorganic anions, such as metal ions, halogen ions, sulfuric acid ions, or nitric acid ions. Sodium, potassium and chlorine are especially undesirable. When these are present, dielectric breakdown tends to occur. Specifically, the amount of such ions is preferably not more than 1,000 ppm by weight.

The inventive composition and application method are not particularly limited and may be applied by any conventional method, of which spin coating is most common. The thickness of the applied film is not subject to any particular limitation, although the applied film may be given, and will often preferably be given, the smallest thickness necessary to fulfill the objects of the invention. The thickness of the applied film is generally in a range of from 15 to 300 nm.

The layer formed by application of the inventive composition is obtained by applying the composition onto the copper wiring layer. However, it is not in fact required that the presence of a laminar material be confirmable as a result of such application. Rather, so long as Cu—OH bonds form, or are capable of forming, on the copper of the copper wiring layer, a layer formed by application of the inventive composition may be regarded as having formed. For example, even should all the ingredients in the composition of the invention volatilize following application, so long as Cu—OH bonds have formed on the copper of the copper wiring layer, a layer formed by application of the inventive composition will be regarded as having formed.

Uses of the silicon-containing insulating film of the invention include any suitable use without particular limitation. Even when not referred to specifically as an "insulating film," so long as such a film has an insulating function, it belongs to the category of insulating films according to the present invention. Such films are most commonly called by such names as diffusion preventing films, diffusion preventing layers, cap layers, etch stopping layers, interlayer dielectric films, interlayer dielectric layers, ILD layers and wiring insulating layers. The insulating film of the invention may preferably be used as a copper diffusion preventing layer. The film thickness is not subject to any particular limitation, and may be set as appropriate for the application. However, in cases where the insulating film is used as a diffusion preventing layer, a thickness in a range of 15 to 80 nm is often appropriate.

The specific dielectric constant of the insulating film of the invention is not subject to any particular limitation. However, the effects of the invention are particularly advantageous when the insulating film is a low-k film having a specific dielectric constant of 4.5 or below. The specific dielectric constant is not subject to any particular lower limit.

To achieve a lower dielectric constant, a material having a low mechanical strength is often selected as the insulating film. In addition, because such a material often has a porous structure, which further lowers the mechanical strength of the insulating film, the use of the insulating film of the invention is desirable in the sense of compensating for this lowered strength.

In the semiconductor device of the invention, it is preferable for Cu—O—Si bonds to form at the copper surface of the copper wiring layer. These bonds are thought to arise through reactions between the insulating layer of the invention and the copper surface. The formation of Cu—O—Si bonds can be detected by Fourier transform infrared spectroscopy (FT-IR).

From such a standpoint, it is preferable for the insulating film of the invention to include Si—OH groups. The presence of Si—OH groups can be detected by Fourier transform infrared spectroscopy (FT-IR). There may be cases in which the Si—OH groups are not present in the inventive composition. That is, so long as Si—OH groups are formed by reactions such as hydrolysis of the inventive composition, the insulating film of the invention will contain Si—OH groups. Also, the above-mentioned Cu—O—Si bonds are believed to arise by reactions between Si—OH groups and Cu—OH bonds, but given that the Si—OH groups present are not all consumed by reaction with Cu—OH, after the insulating film of the invention has been formed then subjected to the subsequently described energy imparting treatment, the remaining Si—OH groups will be detected.

The composition of the insulating film according to the invention may be suitably selected from among known silicon-containing insulating film-forming materials. However, to achieve a low dielectric constant, the composition is preferably a composition which includes silicon and oxygen as the primary ingredients, a composition which includes silicon, oxygen and carbon as the primary ingredients, or a composition which includes silicon, oxygen and nitrogen as the primary ingredients. As used herein, a "primary ingredient" signifies an ingredient which accounts for at least 10 at. % of the insulating film.

The insulating film which includes silicon and oxygen as the primary ingredients may be a $SiO_2$-type insulating film, which is exemplified by films having an atomic compositional ratio close to that of $SiO_2$.

Such compositions include hydrogen. Hydrogen is included in hydroxyl groups, but may be present also in groups resulting from other bonds. These compositions may further include carbon or nitrogen, or both. Carbon and nitrogen are often present in a combined amount of about 20 at. %, but may be present in even higher amounts.

Illustrative examples of such compositions include CVD-SiOC (carbon-doped $SiO_2$ by CVD; specific dielectric constant, from about 3.3 to about 3.5), and nanoclustering silica (NCS; specific dielectric constant, 2.25). These insulating films have a density of generally from about 1.0 to about 3.0.

Compositions which include silicon, oxygen and carbon as the primary ingredients are often produced by using as the starting material a polycarbosilane having silicon and carbon on the main chain, or a polycarboxysilane additionally having oxygen on the main chain, although they may instead be produced from other starting materials.

Such compositions include hydrogen. Hydrogen is included in hydroxyl groups, but may be present also in groups resulting from other bonds. Fluorine may also be present. The fluorine in such cases is often present in a total amount of about 10 at. %, but may be present in a higher amount. Nitrogen may also be present in such compositions, but the amount will be very small if it is not present in the starting materials.

These compositions are exemplified by compositions having a silicon content of about 30 at. %, an oxygen content of about 25 at. % and a carbon content of about 45 at. %. These insulating films have a density of generally from about 1.0 to about 3.0, and a specific dielectric constant of generally from about 2.0 to about 4.5.

Compositions which include silicon, oxygen and nitrogen as the primary ingredients are often produced by using as the starting material a polysilazane containing silicon and nitrogen on the main chain, although they may instead be produced from other starting materials.

Such compositions include hydrogen. Hydrogen is included in hydroxyl groups, but may be present also in groups resulting from other bonds. These compositions may additionally include carbon. The combined amount in such cases is often about 50 at. %, but may be higher than that.

These compositions are exemplified by compositions having a silicon content of about 30 at. %, an oxygen content of about 20 at. %, and a nitrogen content of about 50 at. %. These insulating films have a density of generally from about 1.0 to about 3.0, and a specific dielectric constant of generally from about 4 to about 8.

From the standpoint of the starting materials, in respect of a composition which includes silicon and oxygen as primary ingredients, in the case of CVD-SiOC the insulating film of the invention is formed by plasma CVD using monomethylsilane, dimethylsilane, trimethylsilane, tetramethylsilane, tetraethoxysilane, silane, oxygen, carbon dioxide and the like as the precursor gases. In the case of nanoclustering silica, the insulating film of the invention is formed by adding a thermally decomposable organic compound to a polymer formed by the hydrolysis/condensation polymerization of, for example, tetraalkoxysilane, trialkoxysilane, methyltrialkoxysilane, ethyltrialkoxysilane, propyltrialkoxysilane, phenyltrialkoxysilane, vinyltrialkoxysilane, allyltrialkoxysilane, glycidyltrialkoxysilane, dialkoxysilane, dimethyldialkoxysilane, diethyldialkoxysilane, dipropyldialkoxysilane, diphenyldialkoxysilane, divinyldialkoxysilane, diallyldialkoxysilane, diglycidyldialkoxysilane, phenylmethyldialkoxysilane, phenylethyldialkoxysilane, phenylpropyltrialkoxysilane, phenylvinyldialkoxysilane, phenylallyldialkoxysilane, phenylglycidyldialkoxysilane, methylvinyldialkoxysilane, ethylvinyldialkoxysilane and propylvinyldialkoxysilane; and heating to form pores. More preferably, use can be made of a cluster-type porous silica precursor formed from a quaternary alkylamine because this precursor has a small pore size and uniform pores.

The compositions which include silicon, oxygen and carbon as the primary ingredients and the compositions which include silicon, oxygen and nitrogen as the primary ingredients are preferably formed from compounds which have on the main chain silicon, and at least one element from among carbon and nitrogen, and optionally have also oxygen, and wherein groups bonded to the main chain are hydrocarbon groups which may be substituted with hydroxyl groups. Such compounds generally cure easily, and are thus easy to render into low-k films. In addition, Si—OH groups readily form by hydrolysis. While it is often preferable for an insulating film that has formed from such a compound to have a composition which corresponds to one of the above-described compositions, this is not always a necessary condition.

The compound is exemplified by polycarbosilanes of Formula 1 below, polysilazanes of Formula 2 below, and these silicon compounds in which some or all of the moieties $R^1$ to $R^3$ are substituted with OH radicals. These may be used singly or as mixtures thereof.

[Formula 1]

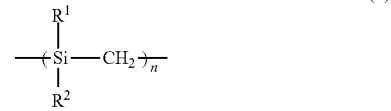

(1)

[Formula 2]

(2)

in Formulas 1 and 2, $R^1$, $R^2$ and $R^3$ are each independently, and independently for Formulas 1 and 2, a hydrogen atom, a substituted or unsubstituted alkyl group, a substituted or unsubstituted alkenyl group, a substituted or unsubstituted cycloalkyl group, or a substituted or unsubstituted aryl group. The letter n is not subject to any particular limitation. However, if it is too small, the volatility will be high, whereas if it is too large, the viscosity will be high. Because either of these cases often pose practical problems, it is preferable for the letter n to be an integer from 10 to 1,000.

$R^1$, $R^2$ and $R^3$ are each exemplified by a hydrogen atom and methyl, ethyl, benzyl and phenyl groups.

The insulating film according to the present invention may be categorized as porous films and nonporous films. Porous insulating films are advantageous in that the specific dielectric constant can be made smaller, but they have a decreased mechanical strength and readily separate from copper, in addition to which they have a low copper diffusion preventing performance. By contrast, nonporous insulating films also hold down the specific dielectric constant, in addition to which they are advantageous in terms of mechanical strength, the ability to prevent separation from the copper, and the copper diffusion preventing performance. In particular, a nonporous insulating film is desirable because, together with improving adhesion to copper in the present invention, it enables a semiconductor device having low-k insulating films of high reliability to be achieved. The degree of nonporosity in this sense may be understood in terms of the density of the insulating film. The insulating film has a density of preferably 1.0 or more. Although there is no particular upper limit, an upper limit of 3 is practical.

The method of manufacturing a semiconductor device according to another aspect of the invention includes the steps of, in order: forming a copper wiring layer, applying to the copper wiring layer a composition which includes at least one substance selected from the group consisting of ammonia and organic bases, and forming a silicon-containing insulating film.

In this aspect of the invention, the conditions and preferred embodiments relating to the copper wiring layer, the composition which includes at least one substance selected from the group consisting of ammonia and organic bases, and the silicon-containing insulating film, and also related factors (e.g., specific dielectric constant, density, formation of Si—OH groups, formation of Cu—O—Si bonds, the insulating film and the composition of the raw material for the insulating film, and the use of a silane coupling agent) are identical to the conditions and preferred embodiments in the above-described aspect of the invention relating to a semiconductor device.

Any publicly known method may be employed without particular limitation as the insulating film forming (insulated film applying) method of the invention. Illustrative examples include spin coating and chemical vapor deposition. Spin coating is most commonly used. Films formed by spin coating include spin-on dielectrics (SOD), such as SOG.

Energy imparting treatment is generally carried out following each of application of the inventive composition, application of the silane coupling agent, and application of the insulating film. Imparting energy in this way is thought to cause Cu—OH bonds to form between the inventive composition and the copper when the composition is applied, and to give rise to coupling with the silane coupling agent when the silane coupling agent is applied. However, this is not to deny that there are cases where Cu—OH bonds have formed prior to imparting energy.

When an insulating film is applied, a crosslinked structure is often obtained. The energy imparting treatment in such cases may be referred to as a "curing treatment." For example, with curing treatment, the above-described polycarbosilane and polysilazane lose some or all of the $R^1$ to $R^3$ moieties and/or Si—OH bonds form, either with or without the cleavage of some of the Si—C bonds and Si—N bonds on the main chain, along with which Si—O—Si bonds form and crosslink. Together with this, numerous pores may form due to the generation of decomposition products.

From the above, the energy imparting treatment according to this invention may be thought of, in terms of its phenomena, as treatment which is capable of giving rise to Cu—OH bonds, coupling, and the formation of a crosslinked structure.

These energy imparting treatments may be carried out after, respectively, application of the composition, application of the silane coupling agent and application of the insulating film according to the invention, although there are also cases in which the treatment may be carried out collectively after application of the composition and application of the silane coupling agent, and cases in which the treatment may be carried collectively after application of the composition, application of the silane coupling agent and application of the insulating film. The latter is often effective and desirable. It is also possible to carry out applications within the same spin coater. In this case, there will be situations in which it is desirable, following each application, to carry out preliminary energy imparting treatment.

In the present invention, "energy imparting treatment" refers to treatment in which energy is imparted by some means to the workpiece. Illustrative examples of the energy imparting treatment include heat treatment, electron beam irradiation treatment, ultraviolet light irradiation treatment, x-ray irradiation treatment, and any combination thereof. That is, the energy source in energy imparting treatment is exemplified by heat, electron beams, ultraviolet light and x-rays. Heat treatment, ultraviolet light irradiation treatment or a combination thereof is preferable from the standpoint of practicality.

The heat treatment temperature is preferably not more than 300° C., more preferably in a range of from 100 to 300° C., and even more preferably in a range of from 100 to 250° C. The conditions of electron beam irradiation treatment, ultraviolet light irradiation treatment and x-ray irradiation treatment may be suitably selected without particular limitation.

Cu—O—Si bonds between the insulating film and the copper may arise also solely from application of the insulating film-forming material to the copper surface, although the formation or increase of such bonds during energy imparting treatment of the type described above appears to be common. The mechanism appears to be one where Cu—OH bonds form, or both form and increase, due to application of the composition to the copper surface, following which, through reactions with the Si—OH group-containing insulating film composition, the bonds are transformed to Cu—O—Si bonds. Si—OH bonds that have formed can be confirmed from the FT-IR spectrum (3400 to 3200 $cm^{-1}$, and 950 to 810 $cm^{-1}$), and Cu—O—Si bonds that have formed can be confirmed from the FT-IR spectrum (3200 to 3000 $cm^{-1}$). When the insulating film-forming material does not include Si—OH groups, the formation of Si—OH groups may arise from the time when the insulating film-forming material is applied to the copper surface up until energy imparting treatment is carried out, and during energy imparting treatment. Specifically, such groups may form prior to energy imparting treatment or through hydrolysis by ambient moisture during energy imparting treatment. Conditions intended to deliberately give rise to Si—OH groups (e.g., increasing ambient humidity, dipping in water) may also be used at the same time.

With regard to the qualities of the copper surface, unlike in the prior art, it has been discovered that an oxidized copper surface is preferable. This is presumably because Cu—OH bonds readily form. The copper surface may be deliberately oxidized for this purpose, although it is also effective, at the time of manufacture, to discontinue the conventional practice of placing the target in a non-oxidizing atmosphere. The latter approach simplifies manufacture and is highly effective. Oxidation of the copper can be detected by, for example, FT-IR or x-ray photoelectron spectroscopy (XPS).

As described above, a semiconductor device having an insulating film which adheres well to the copper serving as the wiring material can be obtained according to the present invention. In this way, semiconductor devices having low-k insulating films with a high reliability can be achieved. Moreover, the improved adhesion is able to contribute also to improved mechanical properties (strength, etc.) in the insulating film.

EXAMPLE 1

A copper film was deposited to a thickness of 40 nm on a silicon wafer by sputtering, and an ethylamine-containing coating solution was spin-coated thereon, forming Cu—OH bonds on the copper surface. Next, a composition of polycarbosilane substituted with hydroxyl groups on side chains was spin-coated onto the Cu—OH bond-enriched copper and heat-treated at 400° C., thereby forming an insulating film having a thickness of 70 nm, a specific dielectric constant of 2.6, and a density of 1.3 $g/cm^3$. This was used as an adhesion test sample. FIG. 1 shows a cross-section of this sample. Referring to FIG. 1, the structure according to the present invention may be thought of as a structure composed of a copper wiring 2 embedded in a copper wiring layer 1, a layer 3 formed on the copper wiring 2 by the application thereto of the composition of the invention, and a silicon-containing insulating film 4 deposited on the layer 3 of the inventive composition. It should be noted that the layer thicknesses shown in FIG. 1 were selected for the purpose of illustration only and bear no relationship to the actual layer thicknesses. The presence or absence of Si—OH and Cu—OH was detected from FT-IR spectra.

EXAMPLE 2

A copper film was deposited to a thickness of 40 nm on a silicon wafer by sputtering, and an ethylamine-containing coating solution followed by a silane coupling agent were spin-coated thereon in this order, forming Cu—OH bonds on the copper surface. Next, a composition of polycarbosilane substituted with hydroxyl groups on side chains was spin-coated onto the Cu—OH bond-enriched copper and heat-treated at 400° C., thereby forming an insulating film having a thickness of 70 nm, a specific dielectric constant of 2.6, and a density of 1.3 g/cm³. This was used as an adhesion test sample.

COMPARATIVE EXAMPLE 1

A copper film was deposited to a thickness of 40 nm on a silicon wafer by sputtering, then copper oxide was removed by $H_2$ annealing at 400° C. Next, a polycarbosilane composition was spin-coated thereon and heat-treated at 400° C., thereby forming an insulating film having a thickness of 70 nm, a specific dielectric constant of 2.6, and a density of 1.3 g/cm³. This was used as an adhesion test sample.

The results are shown in Table 1. Adhesion tests using a Stud-pull tester (Sebastian Five, Quad Group) were carried out on ten samples from each example. It was apparent from the results that the samples obtained in Examples 1 and 2 had excellent adhesions. The presence or absence of Cu—O—Si bonds was detected from FT-IR spectra (3200 to 3000 cm⁻¹).

TABLE 1

| Example | Cu—O—Si bonds | Film separation in adhesion test (out of ten samples) |
|---|---|---|
| Example 1 | present | 2 samples |
| Example 2 | present | 1 samples |
| Comparative Example 1 | absent | 10 samples |

The invention claimed is:
1. A semiconductor device having a copper wiring layer wherein
a layer is formed directly on the copper wiring layer by applying a composition consists essentially of at least one substance selected from the group consisting of ammonia and basic organic compounds selected from the group consisting of ethylamine, phenylamine, benzylamine, ethylenediamine, pentane-1, 2.5-triyltri-amine, benzene-1, 2, 4, 5-tetrayltetraamine, diethylamine, trimethylamine, butyl(ethyl)methylamine, 1-benzofuran-2-ylamine, 4-quinolylamine, bis(2-chloroethyl)amine, (2-chloroethyl)(propyl)amine, (1-chloroethyl)(2-chloroethyl)amine, methyl(methylsilyl)amine, 0-methylhydroxylamine, 0-acetylhydroxylamine, 0-carboxyhydroxylamine, 0-sulphohydroxylamine, N-phenylhydroxylamine, 0-acetyl-N-methylhydroxylamine, and ions thereof onto the copper wiring layer and has a silicon-containing insulating film directly on said layer formed directly on the copper wiring layer.
2. The semiconductor device according to claim 1, wherein the at least one substance is an amino group-containing substance.
3. The semiconductor device according to claim 1, wherein the silicon consisting insulating film contains Si—OH groups.
4. The semiconductor device according to claim 1, wherein Cu—O—Si bonds are formed at a copper surface of the copper wiring layer, the Cu being of the copper wiring layer and the Si being of the silicon-containing insulating film.

5. The semiconductor device according to claim 1, wherein the silicon consisting insulating film comprises:
a composition which comprises silicon and oxygen as primary ingredients,
a composition which comprises silicon, oxygen and carbon as primary ingredients, or
a composition which comprises silicon, oxygen and nitrogen as primary ingredients.
6. The semiconductor device according to claim 1, wherein the silicon consisting insulating film is made of a compound which comprises silicon, and at least one of carbon and nitrogen, and optionally comprises oxygen, on a main chain of said compound, and wherein groups bonded to the main chain are hydrocarbon groups which may be substituted with hydroxyl groups.
7. The semiconductor device according to claim 6, wherein the compound is selected from the group consisting of polycarbosilanes of Formula 1, polysilazanes of Formula 2, and these silicon compounds in which some or all of the moieties $R^1$ to $R^3$ are substituted with OH groups:

[Formula 1]

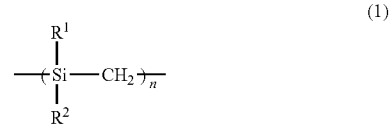

[Formula 2]

$$-(Si(R^1)(R^2)-N(R^3))_n-$$

wherein $R^1$, $R^2$ and $R^3$ are each independently, and independently for Formulas 1 and 2, a hydrogen atom, a substituted or unsubstituted alkyl group, a substituted or unsubstituted alkenyl group, a substituted or unsubstituted cycloalkyl group, or a substituted or unsubstituted aryl group;
and n is an integer from 10 to 1,000.
8. The semiconductor device according to claim 1, which is obtained by carrying out energy imparting treatment following application of the composition consists essentially of said at least one substance selected from the group consisting of ammonia and organic bases.
9. The semiconductor device according to claim 8, wherein the energy imparting treatment is a treatment selected from the group consisting of heat treatment, electron beam irradiation treatment, ultraviolet light irradiation treatment, x-ray irradiation treatment, and any combination thereof.
10. A method of manufacturing a semiconductor device having a copper wiring layer, the method comprising:
forming a copper wiring layer;
applying to the copper wiring layer a composition which consists essentially of at least one substance selected from the group consisting of ammonia and basic organic compounds selected from the group consisting of ethylamine, phenylamine, benzylamine, ethylenediamine, pentane-1, 2, 5-triyltriamine, benzene-1, 2, 4, 5-tetrayltetraamine, diethylamine, trimethylamine, butyl(ethyl)methylamine, 1-benzofuran-2-ylamine, 4-quinolylamine, bis(2-chloroethyl)amine, (2-chloroethyl)(propyl)amine, (1-chloroethyl)(2-choloroethyl)amine, methyl(methylsilyl)amine, 0-methylhydroxylamine, 0-acetylhydroxylamine, 0-carboxyhydroxylamine, 0-sulphohydroxylamine, N-phenylhydroxylamine, 0-acetyl-N-methylhydroxylamine, and ions thereof; and then forming a silicon-containing insulating film so that said composition is formed directly on said copper wiring layer, and said silicon-containing insulating film is formed directly on said composition.

11. The semiconductor device manufacturing method according to claim 10, wherein the at least one substance is an amino group-containing substance.

12. The semiconductor device manufacturing method according to claim 10, wherein a copper surface of the copper wiring layer is oxidized before applying the composition.

13. The semiconductor device manufacturing method according to claim 10, wherein the silicon consisting insulating film comprises Si—OH groups.

14. The semiconductor device manufacturing method according to claim 10, wherein Cu—O—Si bonds are formed at the copper surface of the copper wiring layer, the Cu being of the copper wiring layer and the Si being of the silicon-containing insulating film.

15. The semiconductor device manufacturing method according to claim 10, wherein the silicon consisting insulating film comprises:
   a composition which comprises silicon and oxygen as primary ingredients,
   a composition which comprises silicon, oxygen and carbon as primary ingredients, or
   a composition which comprises silicon, oxygen and nitrogen as primary ingredients.

16. The semiconductor device manufacturing method according to claim 10, wherein the silicon consisting insulating film is made of a compound which comprises on a main chain silicon, and at least one of carbon and nitrogen, and optionally comprises oxygen, and wherein groups bonded to the main chain are hydrocarbon groups which may be substituted with hydroxyl groups.

17. The semiconductor device manufacturing method according to claim 16, wherein the compound is selected from the group consisting of polycarbosilanes of Formula 1, polysilazanes of Formula 2, and these silicon compounds in which some or all of the moieties $R^1$ to $R^3$ are substituted with OH groups:

[Formula 1]

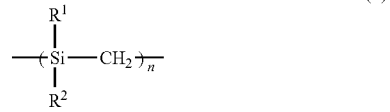

(1)

[Formula 2]

(2)

wherein, $R^1$, $R^2$ and $R^3$ are each independently, and independently for Formulas 1 and 2, a hydrogen atom, a substituted or unsubstituted alkyl group, a substituted or unsubstituted alkenyl group, a substituted or unsubstituted cycloalkyl group, or a substituted or unsubstituted aryl group;

and n is an integer from 10 to 1,000.

18. The semiconductor device manufacturing method according to claim 10, further comprising:
   carrying out energy imparting treatment, following application of the composition.

19. The semiconductor device manufacturing method according to claim 18, wherein the energy imparting treatment is a treatment selected from the group consisting of heat treatment, electron beam irradiation treatment, ultraviolet light irradiation treatment, x-ray irradiation treatment, and any combination thereof.

* * * * *